(12) United States Patent
Nishi et al.

(10) Patent No.: US 12,289,836 B2
(45) Date of Patent: Apr. 29, 2025

(54) METHOD FOR MANUFACTURING MOUNTING SUBSTRATE, AND COMPONENT MOUNTING DEVICE

(71) Applicant: Panasonic Intellectual Property Management Co., Ltd., Osaka (JP)

(72) Inventors: Syoichi Nishi, Fukuoka (JP); Hideki Sumi, Fukuoka (JP); Hiroshi Murata, Saga (JP); Koji Sakurai, Fukuoka (JP); Kenichi Ichikawa, Fukuoka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 509 days.

(21) Appl. No.: 17/637,101

(22) PCT Filed: Jun. 9, 2020

(86) PCT No.: PCT/JP2020/022605
§ 371 (c)(1),
(2) Date: Feb. 22, 2022

(87) PCT Pub. No.: WO2021/044688
PCT Pub. Date: Mar. 11, 2021

(65) Prior Publication Data
US 2022/0287212 A1 Sep. 8, 2022

(30) Foreign Application Priority Data
Sep. 2, 2019 (JP) ................. 2019-159287

(51) Int. Cl.
*H05K 13/00* (2006.01)
*H05K 13/08* (2006.01)
(52) U.S. Cl.
CPC ....... *H05K 13/089* (2018.08); *H05K 13/0812* (2018.08); *H05K 13/0815* (2018.08)

(58) Field of Classification Search
CPC ........... H05K 13/0812; H05K 13/0813; H05K 13/0815; H05K 13/089
See application file for complete search history.

(56) References Cited

U.S. PATENT DOCUMENTS 6,853,874 B2 * 2/2005 Kawada ............ H05K 13/0061
414/800
8,194,241 B2 * 6/2012 Hayashi .................. G01B 11/24
356/237.1
(Continued)

FOREIGN PATENT DOCUMENTS

CN 105916367 A 8/2016
JP 2013-214781 10/2013
(Continued)

OTHER PUBLICATIONS

Extended European Search Report dated Sep. 28, 2022 for the related European Patent Application No. 20860268.0.
(Continued)

*Primary Examiner* — Paul D Kim
(74) *Attorney, Agent, or Firm* — McDonald Hopkins LLC

(57) ABSTRACT

A method for manufacturing a mounting board includes a first outer shape position acquisition step, a feature portion position acquisition step, a calculation step, a holding step, a second outer shape position acquisition step, and a mounting step. In the first outer shape position acquisition step, a first outer shape position of a component is acquired. In the feature portion position acquisition step, a position of a feature portion is acquired. In the calculation step, a deviation amount of the position of the feature portion with respect to the first outer shape position is calculated. In the second outer shape position acquisition step, a second outer shape position of the component is acquired. In the mounting step, the feature portion of the component is mounted to (Continued)

be positioned on a target position of a board based on the second outer shape position and the deviation amount.

14 Claims, 12 Drawing Sheets

(56) References Cited

U.S. PATENT DOCUMENTS

| | | | |
|---|---|---|---|
| 9,999,169 | B2 | 6/2018 | Sumi |
| 11,304,351 | B2 * | 4/2022 | Baba .................. H05K 13/0813 |
| 2013/0160282 | A1 | 6/2013 | Kawaguchi et al. |
| 2016/0249499 | A1 | 8/2016 | Sumi |
| 2019/0133010 | A1 | 5/2019 | Sakurayama et al. |

FOREIGN PATENT DOCUMENTS

| | | |
|---|---|---|
| JP | 2015-126216 | 7/2015 |
| JP | 2016-157754 | 9/2016 |
| WO | 2016/035135 | 3/2016 |

OTHER PUBLICATIONS

International Search Report of PCT application No. PCT/JP2020/022605 dated Jul. 21, 2020.
English Translation of Chinese Search Report dated May 27, 2024 for the related Chinese Patent Application No. 202080061156.4.

\* cited by examiner

METHOD FOR MANUFACTURING MOUNTING SUBSTRATE, AND COMPONENT MOUNTING DEVICE

CROSS-REFERENCE TO RELATED APPLICATIONS

This application is a U.S. national stage application of the PCT International Application No. PCT/JP2020/022605 filed on Jun. 9, 2020, which claims the benefit of foreign priority of Japanese patent application No. 2019-159287 filed on Sep. 2, 2019, the contents all of which are incorporated herein by reference.

TECHNICAL FIELD

The present disclosure relates to a method for manufacturing a mounting board for mounting a component on a board and a component mounter.

BACKGROUND ART

In related art, a mounting board on which a plurality of light emitting components such as light emitting diodes (LEDs) are mounted side by side, such as a lighting board of a liquid crystal panel, is manufactured by a component mounter (see, for example, PTL 1). In the component mounter described in PTL 1, the light emitting component supplied by a tape feeder is picked up by a suction nozzle, and the light emitting component held by the suction nozzle is imaged from below by a component camera to measure the deviation amount of the suction nozzle and the held light emitting component, and a lighting board is manufactured by repeating the operation of correcting the deviation amount and mounting the light emitting component at a predetermined position on a board.

CITATION LIST

Patent Literature

PTL 1: Japanese Unexamined Patent Publication No. 2013-214781

SUMMARY OF THE INVENTION

A method for manufacturing a mounting board of the present disclosure includes a first outer shape position acquisition step, a feature portion position acquisition step, a calculation step, a holding step, a second outer shape position acquisition step, and a mounting step.

In the first outer shape position acquisition step, a component is imaged from a first direction to acquire a first outer shape position of the component.

In the feature portion position acquisition step, the component is imaged from the first direction to acquire a position of a feature portion formed on the component.

In the calculation step, the deviation amount of the position of the feature portion with respect to the first outer shape position is calculated from the first outer shape position and the position of the feature portion.

In the holding step, the component is held by a holding member.

In the second outer shape position acquisition step, the component held by the holding member is imaged from a second direction different from the first direction to acquire a second outer shape position of the component.

In the mounting step, the component is mounted to a board so that the feature portion of the component is positioned on a target position of the board based on the second outer shape position and the deviation amount.

A component mounter of the present disclosure includes a component supply mechanism, a first outer shape position acquisition unit, a feature portion position acquisition unit, a deviation amount calculator, a component mounting unit, a controller, and a second outer shape position acquisition unit.

The component supply mechanism supplies a component.

The first outer shape position acquisition unit images the component supplied by the component supply mechanism from a first direction to acquire a first outer shape position of the component.

The feature portion position acquisition unit images the component supplied by the component supply mechanism from the first direction to acquire a position of a feature portion formed on the component.

The deviation amount calculator calculates a deviation amount of the position of the feature portion with respect to the first outer shape position from the first outer shape position and the position of the feature portion.

The component mounting unit holds the component with a holding member to mount the component on a board.

The controller controls an operation of the component mounting unit.

The second outer shape position acquisition unit images the component held by the holding member from a second direction different from the first direction to acquire a second outer shape position of the component.

The controller causes the component mounting unit to mount the component to a board so that the feature portion of the component is positioned on a target position of the mounting board based on the second outer shape position and the deviation amount.

DESCRIPTION OF EMBODIMENT

In a light emitting component, the position of the light emitting portion that emits light in an entire component is slightly deviated in each component caused by the manufacture of the light emitting component. In recent years, the demand for the position accuracy of the light emitting portion on a board has become stricter. However, in the related art including PTL 1, although the outer shape of a component and the position of an electrode are mounted accurately at a target position on a board, the position of a light emitting portion of a light emitting component is not necessarily mounted accurately on a board. Therefore, there was room for further improvement.

Figure 1:
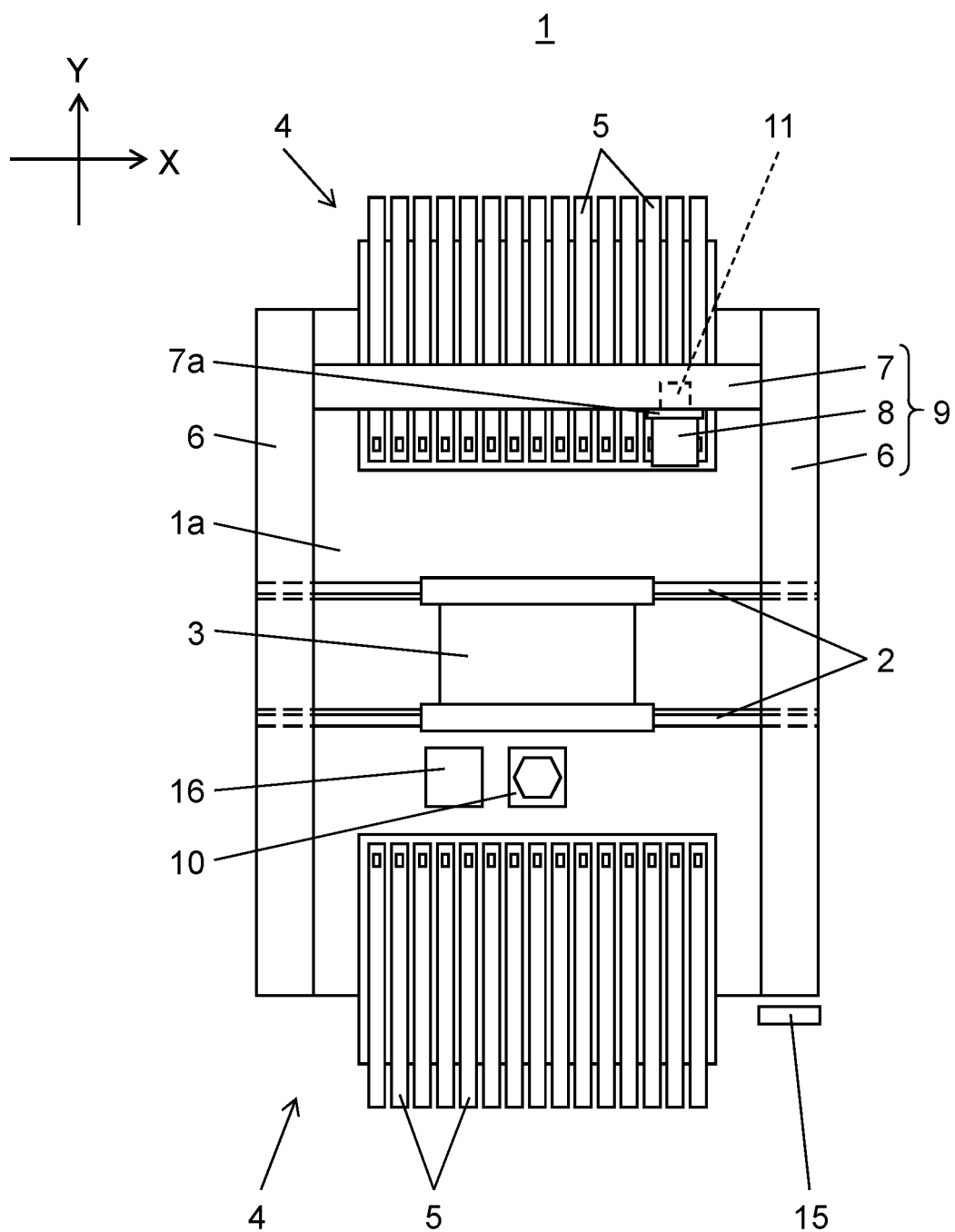
FIG. 1 is a plan view of a component mounter according to an exemplary embodiment.
Figure 2:
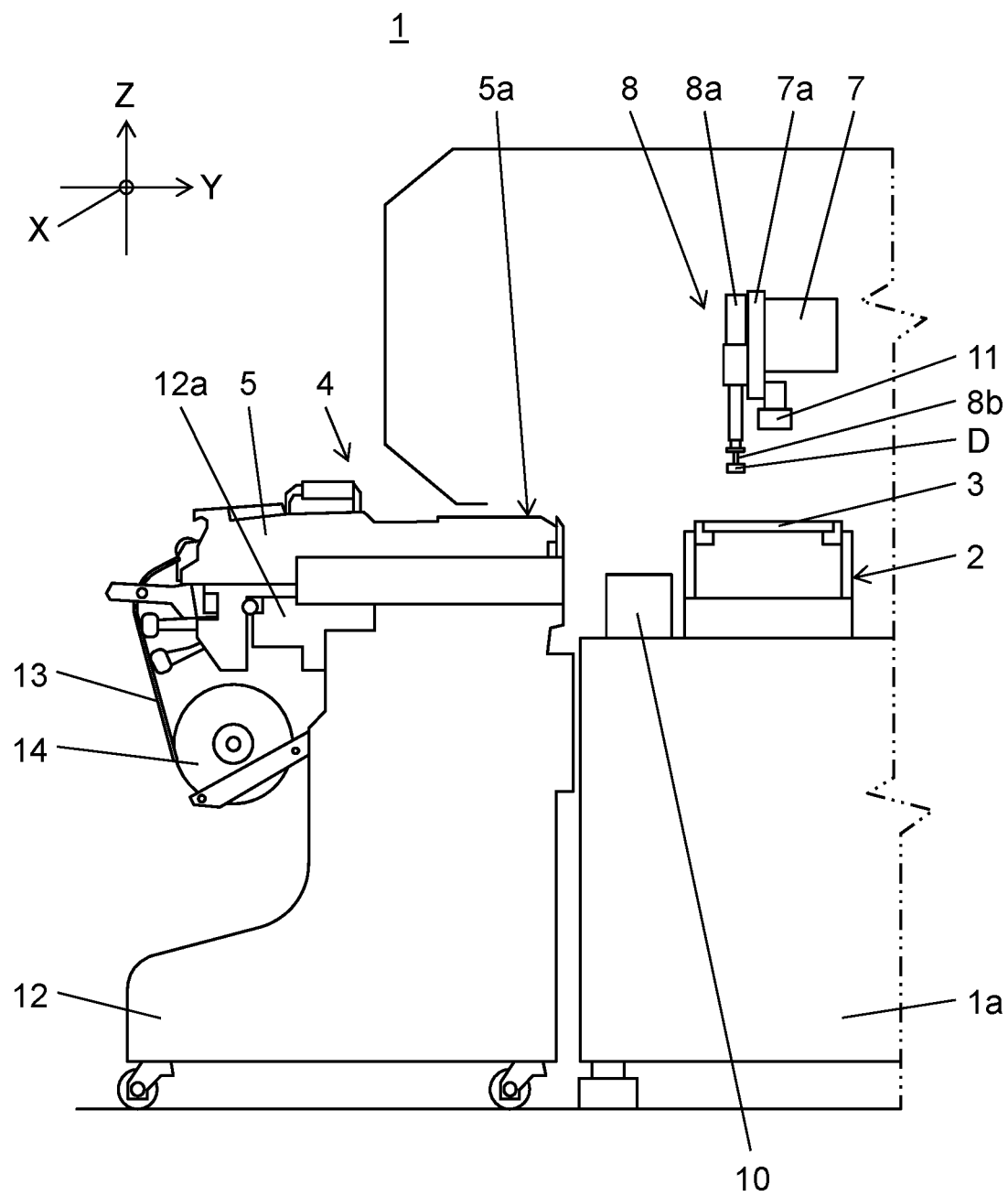
FIG. 2 is a configuration explanatory view of the component mounter according to the exemplary embodiment.

Hereinafter, an exemplary embodiment of the present disclosure will be described in detail with reference to drawings. The configuration, shape, and the like described below are examples for description, and can be appropriately changed according to the specifications of a component mounter. In the following, the corresponding elements are designated by the same reference numerals in all the drawings, and duplicate description will be omitted. In FIG. 1 and a part described later, as biaxial directions orthogonal to each other in a horizontal plane, an X direction (horizontal direction in FIG. 1) in a board transport direction and a Y direction (vertical direction in FIG. 1) orthogonal to the board transport direction are shown. In FIG. 2 and a part described later, a Z direction (vertical direction in FIG. 2) is shown as a height direction orthogonal to the horizontal plane. In FIG. 7, a θ direction, which is the direction of rotation with an axis in the Z direction (Z axis) as a rotation axis, is shown.

First, the configuration of component mounter 1 will be described with reference to FIGS. 1 and 2. FIG. 2 schematically shows a part of component mounter 1 in FIG. 1. Component mounter 1 has a function of executing a component mounting operation of mounting a component supplied from component supply units 4 on a board. Board transport mechanism 2 is disposed in the X direction in the center of base 1a. Board transport mechanism 2 carries board 3 transported from the upstream to a mounting working position and positions and holds board 3. Further, board transport mechanism 2 carries out board 3 for which the component mounting operation has been completed to the downstream.

Component supply units 4 are disposed on both sides of board transport mechanism 2. A plurality of tape feeders 5 are installed in parallel on each component supply unit 4. Tape feeder 5 pitch-feeds a component tape having a pocket for storing component D from the outside of component supply unit 4 in a direction (tape feed direction) toward board transport mechanism 2 to supply component D to component supply position 5a from which component D is picked up by a mounting head described below. In component supply unit 4, a tray feeder that supplies components D that are regularly placed on a tray in a grid pattern or a bulk feeder that supplies components D in a state of being irregularly loaded in bulk on the tray may be installed. Tape feeder 5, the tray feeder, and the bulk feeder are component supply means (component supply mechanism) for supplying the component.

In FIGS. 1 and 2, Y-axis tables 6 provided with a linear drive mechanism are disposed along the Y direction at both ends in the X direction on the upper surface of base 1a. Beam 7 similarly provided with a linear drive mechanism is coupled to Y-axis table 6 to move freely in the Y direction. Beam 7 is disposed along the X direction. Mounting head 8 is installed on beam 7 to move freely in the X direction. Mounting head 8 includes suction unit 8a that can suck and hold component D and move up and down. Suction nozzle 8b that sucks and holds component D is installed to each lower end of suction unit 8a. Mounting head 8 may hold component D by a pair of chucks that sandwich and hold the side surface of component D. That is, suction nozzle 8b and the pair of chucks are holding members that hold component D.

In FIG. 1, by driving Y-axis table 6 and beam 7, mounting head 8 moves in the X direction and the Y direction. As a result, mounting head 8 sucks and picks up component D from component supply position 5a of tape feeder 5 disposed in component supply unit 4 by suction nozzle 8b, and executes a turn of mounting to install component D at the mounting position of board 3 positioned on board transport mechanism 2. That is, Y-axis table 6, beam 7, and mounting head 8 constitute component mounting means 9 (component mounting unit) for holding component D supplied to component supply position 5a of tape feeder 5 (component supply means and component supply mechanism) by suction nozzle 8b (holding member) to mount component D on board 3.

Component recognition camera 10 is disposed between component supply unit 4 and board transport mechanism 2. When mounting head 8 from which the component is picked up from component supply unit 4 moves above component recognition camera 10, component recognition camera 10 images component D in a state of being held by mounting head 8 to recognize the posture of held component D. Head camera 11 is attached to plate 7a to which mounting head 8 is attached. Head camera 11 moves integrally with mounting head 8.

When mounting head 8 moves, head camera 11 moves above board 3 positioned by board transport mechanism 2 and images a board mark (not shown) provided on board 3 to recognize the position of board 3. Further, head camera 11 moves above component supply position 5a of tape feeder 5 to recognize the state of the component tape near component supply position 5a. In the component mounting operation on board 3 by mounting head 8, the mounting position is corrected by taking into consideration the recognition result of component D by component recognition camera 10, recognition result of component D by head camera 11, and the recognition result of the board position.

In FIG. 2, carriage 12 in which a plurality of tape feeders 5 are previously installed is set on feeder base 12a of component supply unit 4. Carriage 12 holds tape reel 14 for storing component tape 13 holding component D in a wound state. Component tape 13 drawn from tape reel 14 is pitch-fed to component supply position 5a by tape feeder 5.

In FIG. 1, touch panel 15 operated by an operator is installed at a position where the operator works on the front surface of component mounter 1. Various information is displayed on the display unit of touch panel 15. Then, the operator performs data input and an operation of component mounter 1 by using the operation buttons displayed on the display unit. Component disposal unit 16 is installed next to component recognition camera 10. Component D such as a defective component, which is supplied from component supply unit 4 but is not mounted on board 3, is disposed of in component disposal unit 16.

Figure 3:
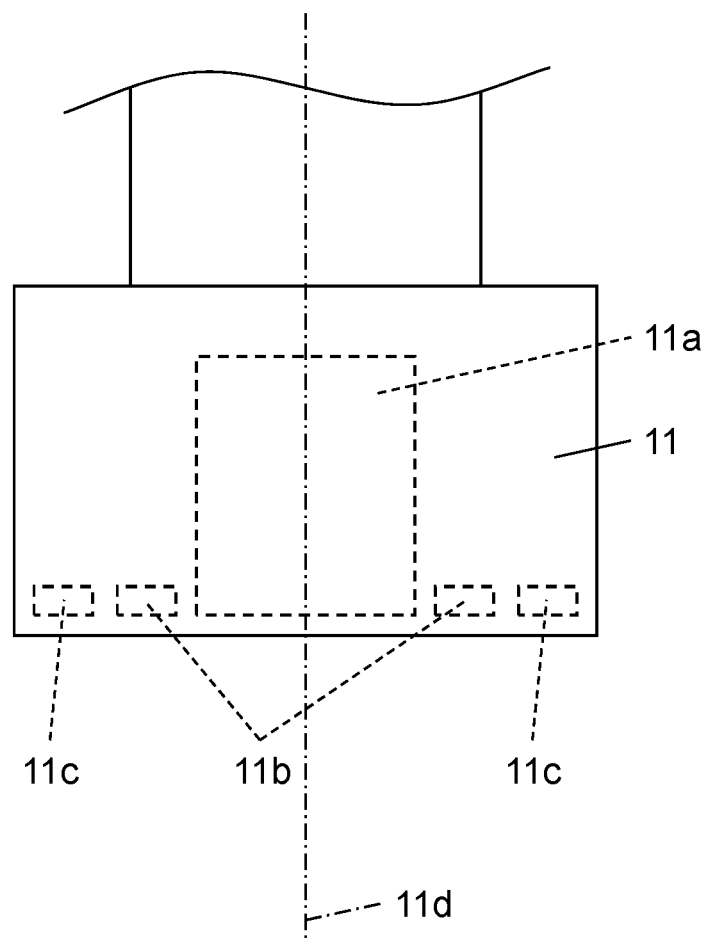
FIG. 3 is a configuration explanatory view of a head camera provided in the component mounter according to the exemplary embodiment.

Next, the details of head camera 11 will be described with reference to FIG. 3. Head camera 11 includes imaging unit 11a, first lighting unit 11b, and second lighting unit 11c. Imaging unit 11a is a camera installed with optical axis 11d facing downward. First lighting unit 11b is disposed around imaging unit 11a and lights the object to be imaged by imaging unit 11a. First lighting unit 11b emits light having an angle and wavelength suitable for lighting component D.

Second lighting unit 11c is positioned around imaging unit 11a and is disposed outside first lighting unit 11b as seen from optical axis 11d of imaging unit 11a, and lights the object to be imaged by imaging unit 11a. Second lighting unit 11c emits light suitable for lighting light emitting portion S (see FIG. 4) formed in component D described later. For example, second lighting unit 11c emits light having an angle and wavelength suitable for emitting the phosphor contained in light emitting portion S.

In head camera 11, the lighting conditions used to light by first lighting unit 11b and second lighting unit 11c are changed according to the object to be imaged. For example, head camera 11 lights only with first lighting unit 11b or only with second lighting unit 11c depending on the object to be imaged. Alternatively, head camera 11 uses first lighting unit 11b and second lighting unit 11c at the same time, or changes the intensity of the light emitted by first lighting unit 11b and second lighting unit 11c for lighting.

Figure 4A:
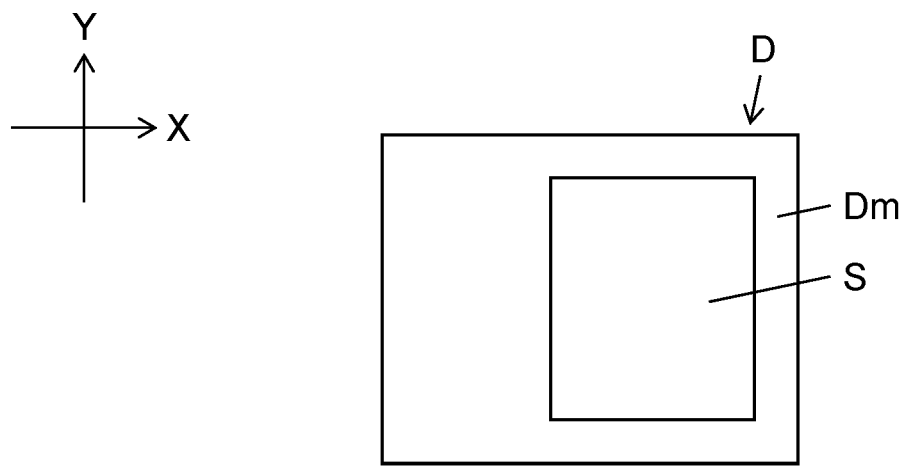
FIG. 4A is a plan view of a component mounted on a board by the component mounter according to the exemplary embodiment.
Figure 4B:
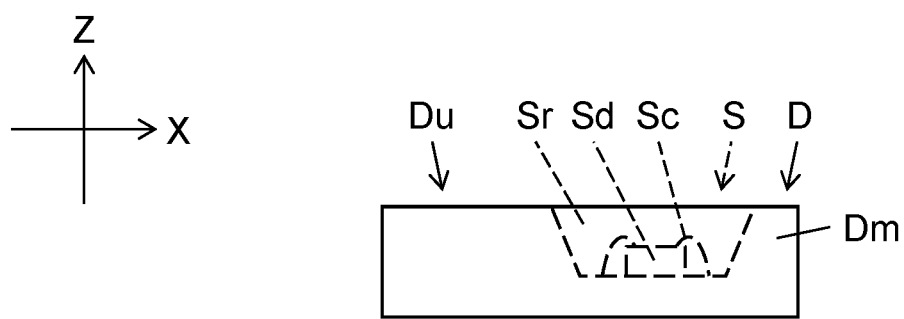
FIG. 4B is a side view of the component mounted on a board by the component mounter according to the exemplary embodiment.

Next, with reference to FIGS. 4A and 4B, the structure of a light emitting element such as a chip LED for surface mounting, which is a component mounted on board 3, will be described. Hereinafter, the light emitting element is simply referred to as "component D". Light emitting portion S is formed on a part of upper surface Du of main body Dm of component D. Light emitting portion S is a feature portion having a function of emitting light when a voltage is applied to component D from the outside. In the manufacturing process of component D, after LED chip Sd mounted in the cavity and the internal electrode are connected by internal wiring Sc, sealing resin Sr in which the phosphor is dispersed is poured into the cavity to form light emitting portion S. Therefore, the position of light emitting portion S in component D varies from component D to component D.

Figure 5A:
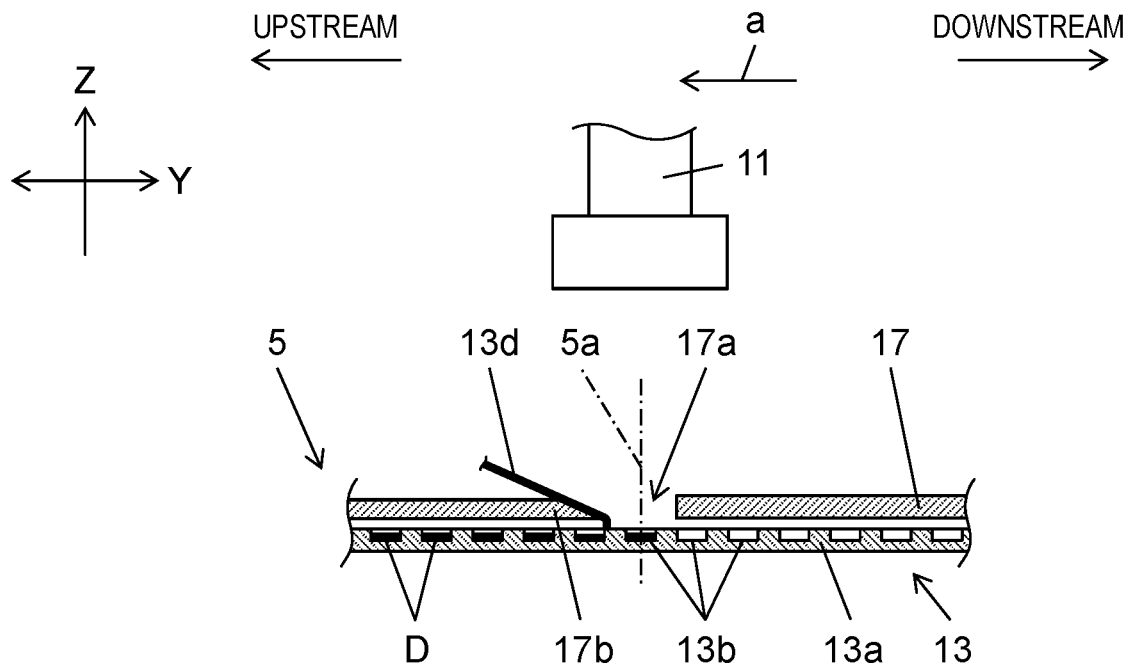
FIG. 5A is an explanatory view in which a pocket pitch-fed to a component supply position of a tape feeder provided in the component mounter according to the exemplary embodiment is imaged by the head camera.

Next, the recognition operation of component D supplied to component supply position 5a by head camera 11 will be described with reference to FIGS. 5A and 5B. In FIG. 5A, pressing member 17 that guides component tape 13 from above is disposed above tape feeder 5. Pressing member 17 is provided with opening portion 17a positioned at component supply position 5a.

Figure 5B:
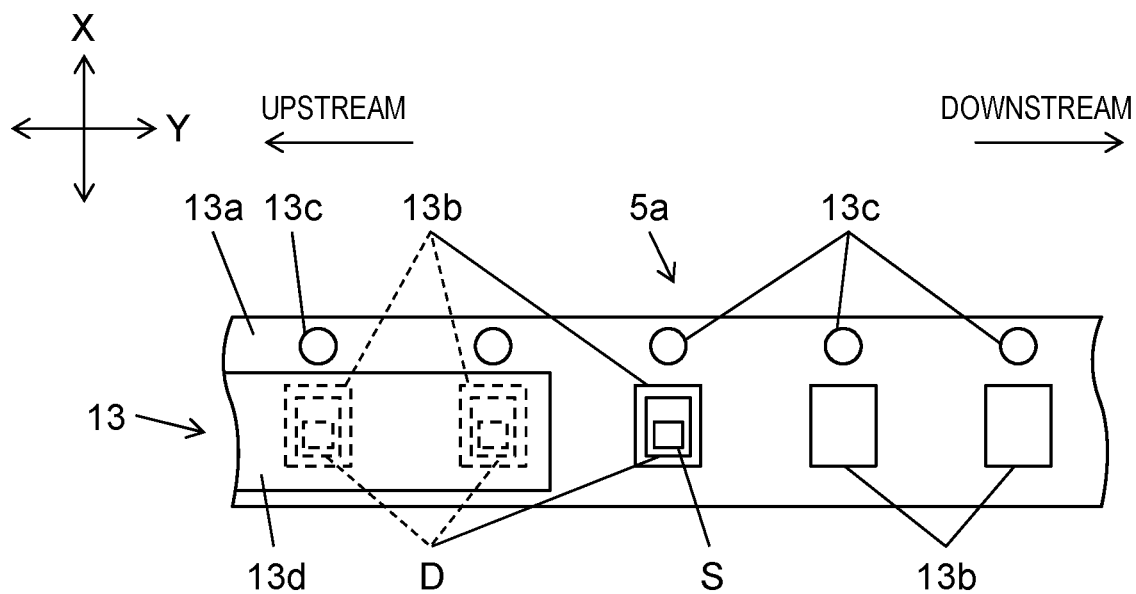
FIG. 5B is a structural explanatory view of a component tape pitch-fed to a component supply position of the tape feeder provided in the component mounter according to the exemplary embodiment.

FIG. 5B shows a state in which component tape 13 near component supply position 5a is viewed from above, and pressing member 17 is omitted. Base tape 13a of component tape 13 is formed with concave pockets 13b for storing component D and feed holes 13c for engaging a sprocket (not shown) for pitch-feeding component tape 13 at equal intervals. Cover tape 13d is attached to the upper surface of pocket 13b in which component D is stored.

In FIG. 5A, cover tape 13d is peeled off at edge portion 17b of opening portion 17a and folded back. As a result, the upper side of pocket 13b on the downstream (right side in FIG. 5A) including component supply position 5a is opened. By driving Y-axis table 6 and beam 7, head camera 11 moves above component supply position 5a (arrow a) and passes through opening portion 17a to image component D stored in pocket 13b of component supply position 5a.

Figure 6A:
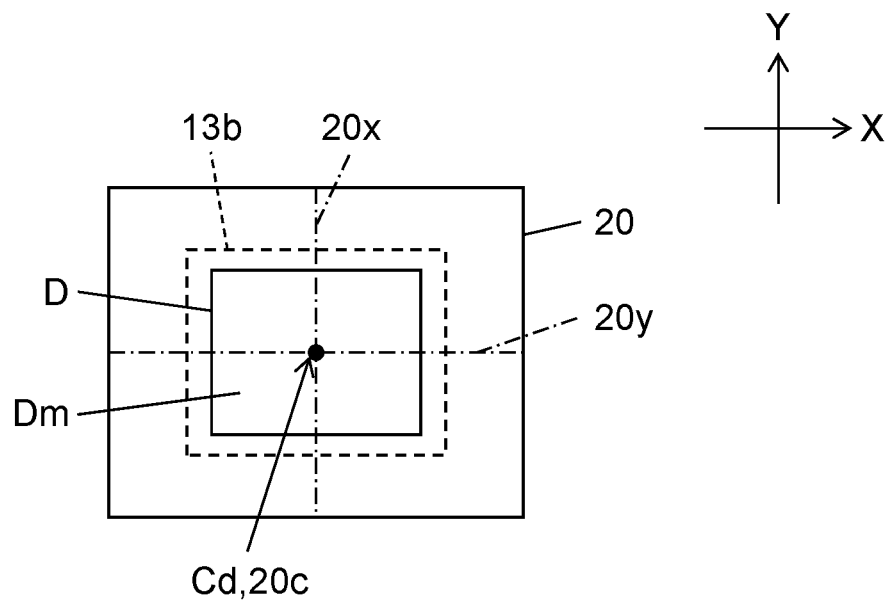
FIG. 6A is a view showing an example in which the component supplied by the tape feeder provided in the component mounter according to the exemplary embodiment is imaged by the head camera while being lit by a first light.
Figure 6B:
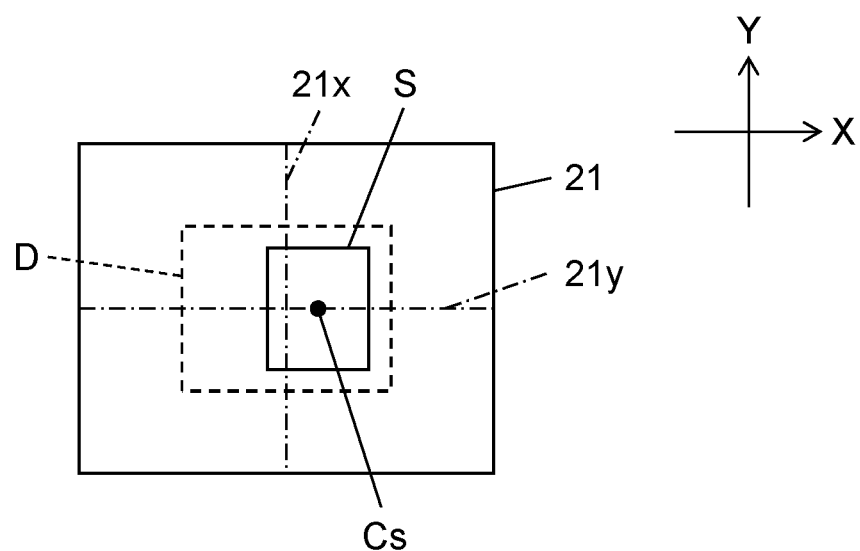
FIG. 6B is a view showing an example in which the component supplied by the tape feeder provided in the component mounter according to the exemplary embodiment is imaged by the head camera while being lit by a second light.

Next, with reference to FIGS. 6A and 6B, an example of a captured image of component D stored in pocket 13b of component supply position 5a imaged by head camera 11 will be described. In FIGS. 6A and 6B, same component D is imaged under different lighting conditions. An example is shown in which there is no relative deviation between component D stored in pocket 13b and head camera 11 and there is no deviation of light emitting portion S in component D.

In FIG. 6A, head camera 11 images component D in pocket 13b by imaging unit 11a under a first lighting condition of lighting with first lighting unit 11b. In captured image 20, main body Dm of component D, that is, the outer shape of component D is displayed. Center 20c of captured image 20 coincides with the center of the outer shape of component D. Hereinafter, the center of the outer shape of component D as seen from above is referred to as "upper surface outer shape position Cd". In captured image 20, center line 20x in the X direction and center line 20y in the Y direction are superimposed and displayed. Under the first lighting condition, the edge of pocket 13b shown by the dotted line may also be captured, but for convenience, the display of pocket 13b in the captured image is omitted.

The imaging result by head camera 11 is transferred to controller 30 provided in component mounter 1, and is recognized by recognition processing unit 31 (see FIG. 8) provided in controller 30. Recognition processing unit 31 recognizes upper surface outer shape position Cd and the posture (rotation angle θd in the horizontal plane) of component D from captured image 20. In this way, imaging unit 11a, first lighting unit 11b, and recognition processing unit 31 (tape feeder 5) are first outer shape position acquisition means (first outer shape position acquisition unit) for imaging component D supplied by the component supply means from the first direction (upper side) to acquire upper surface outer shape position Cd (first outer shape position) of component D. The first outer shape position acquisition means images component D in a state in which component D is lit under the first lighting condition.

In FIG. 6B, head camera 11 images component D in pocket 13b by imaging unit 11a under a second lighting condition of lighting with second lighting unit 11c. Light emitting portion S is displayed on captured image 21. In captured image 21, center line 21x in the X direction and center line 21y in the Y direction are superimposed and displayed. Recognition processing unit 31 recognizes the center of light emitting portion S (hereinafter, referred to as "position Cs of the feature portion") and the posture (rotation angle $\theta s$ in the horizontal plane) from captured image 21. In this way, imaging unit 11a, second lighting unit 11c, and recognition processing unit 31 are feature portion position acquisition means (feature portion position acquisition unit) for imaging component D supplied by the component supply means (tape feeder 5) from the first direction (upper side) to acquire position Cs of the feature portion formed on component D.

The feature portion position acquisition means images the component in a state in which component D is lit under the second lighting condition, which is a different lighting condition from the first lighting condition. Further, in the present exemplary embodiment, the first outer shape position acquisition means and the feature portion position acquisition means share a camera (imaging unit 11a) that images component D, and image component D stored in pocket 13b. As a result, it is not necessary to move head camera 11 between imaging the outer shape of component D and imaging light emitting portion S.

In the above, under the first lighting condition, only first lighting unit 11b is used for lighting, and under the second lighting condition, only second lighting unit 11c is used for lighting, but the present disclosure is not limited thereto. That is, under the first lighting condition, component D may be lit with at least light having a wavelength suitable for lighting main body Dm of component D, and under the second lighting condition, component D may be lit with at least light having a wavelength suitable for lighting light emitting portion S (feature portion).

Figure 7A:
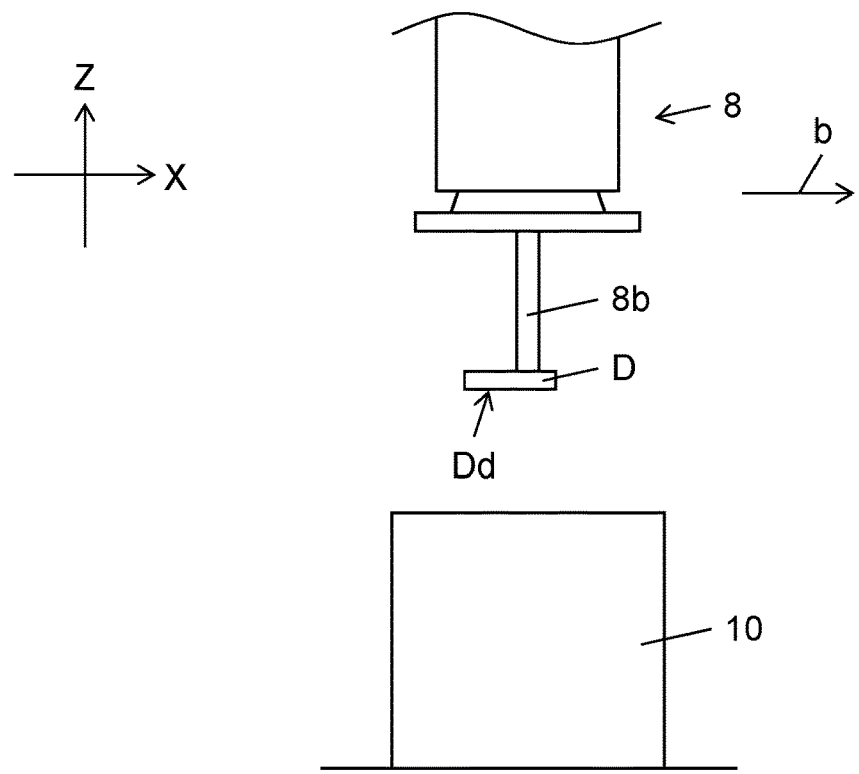
FIG. 7A is an explanatory view in which the component is imaged by a component camera provided in the component mounter according to the exemplary embodiment.

Next, the recognition operation of component D by component recognition camera 10 will be described with reference to FIG. 7. In the component mounting operation by mounting head 8, as shown in FIG. 7A, when mounting head 8 that has sucked and held component D by suction nozzle 8b moves above component recognition camera 10 in a predetermined direction (arrow b), lower surface Dd of component D is imaged from the lower side.

Figure 7B:
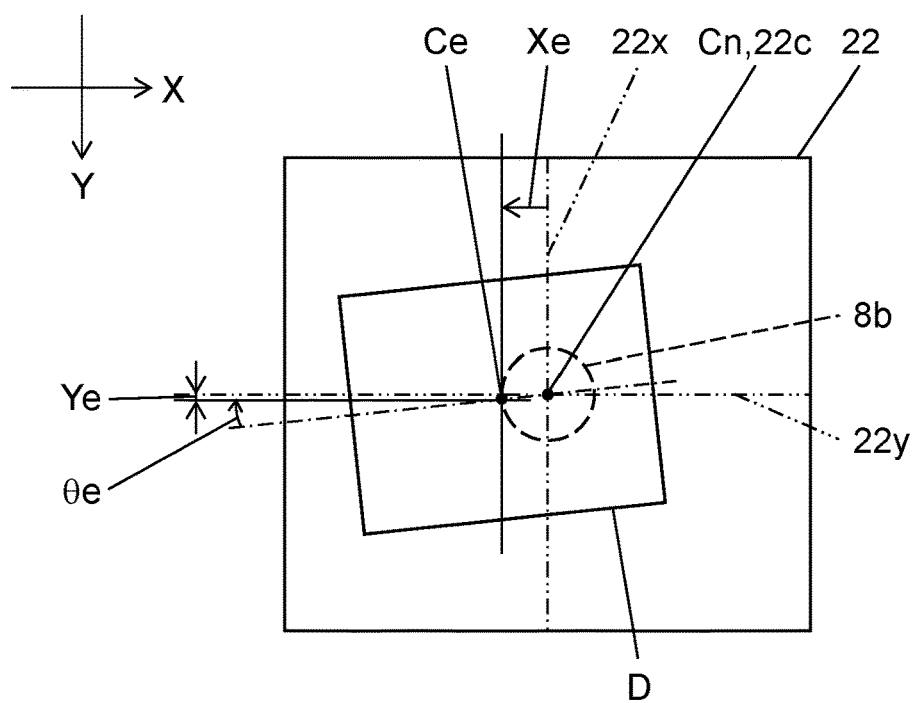
FIG. 7B is a view showing an example of an image captured by the component camera provided in the component mounter according to the exemplary embodiment.

FIG. 7B shows an example of captured image 22 captured by moving mounting head 8 so that nozzle center Cn of suction nozzle 8b coincides with center 22c of captured image 22. In captured image 22, center line 22x in the X direction and center line 22y in the Y direction are superimposed and displayed. The intersection of center line 22x in the X direction and center line 22y in the Y direction is center 22c of captured image 22. The imaging result is transferred to controller 30 and recognized by recognition processing unit 31, and the position (hereinafter, referred to as "lower surface outer shape position Ce") and posture (rotation angle $\theta e$ in the horizontal plane) of the center of component D are recognized.

Recognition processing unit 31 calculates lower surface outer shape position Ce (Xe, Ye, $\theta e$) from recognized lower surface outer shape position Ce. Here, lower surface outer shape position Ce (Xe, Ye, $\theta e$) indicates a position of the center of component D in the X direction, the Y direction, and the $\theta$ direction from nozzle center Cn (center 22c of captured image 22) of suction nozzle 8b sucking component D. In this way, component recognition camera 10 and recognition processing unit 31 are second outer shape position acquisition means (second outer shape position acquisition unit) for imaging component D held by the holding member (suction nozzle 8b) from a second direction (lower side) different from the first direction (upper side) to acquire lower surface outer shape position Ce (second outer shape position) of component D.

Next, the configuration of the control system of component mounter 1 will be described with reference to FIG. 8. Component mounter 1 includes controller 30, board transport mechanism 2, tape feeder 5, component mounting means 9, component recognition camera 10, head camera 11, and touch panel 15. Controller 30 includes recognition processing unit 31, deviation amount calculator 32, outer shape position variation calculator 33, correction value calculator 34, mounting operation processing unit 35, and mounting storage unit 36. Mounting storage unit 36 is a storage device, and includes mounting data storage unit 37, recognition result storage unit 38, deviation amount storage unit 39, variation amount storage unit 40, determination value storage unit 41, and correction value storage unit 42.

Mounting data storage unit 37 stores data such as component mounting position Cf and light emitting portion mounting position Cg (see FIG. 10) for each type of board 3 to be manufactured. Here, component mounting position Cf is the mounting target position on board 3 of upper surface outer shape position Cd of component D. Light emitting portion mounting position Cg is a mounting target position on board 3 of position Cs of the feature portion of component D. Mounting data storage unit 37 stores the XY coordinates and the rotation angle $\theta$ on board 3 as component mounting position Cf and light emitting portion mounting position Cg. Further, mounting data storage unit 37 stores ideal position Cs0 (Xs0, Ys0) (see FIG. 10) of the feature portion as seen from upper surface outer shape position Cd of component D, as information on the position of light emitting portion S on component D when there is no manufacturing variation of component D.

Figure 8:
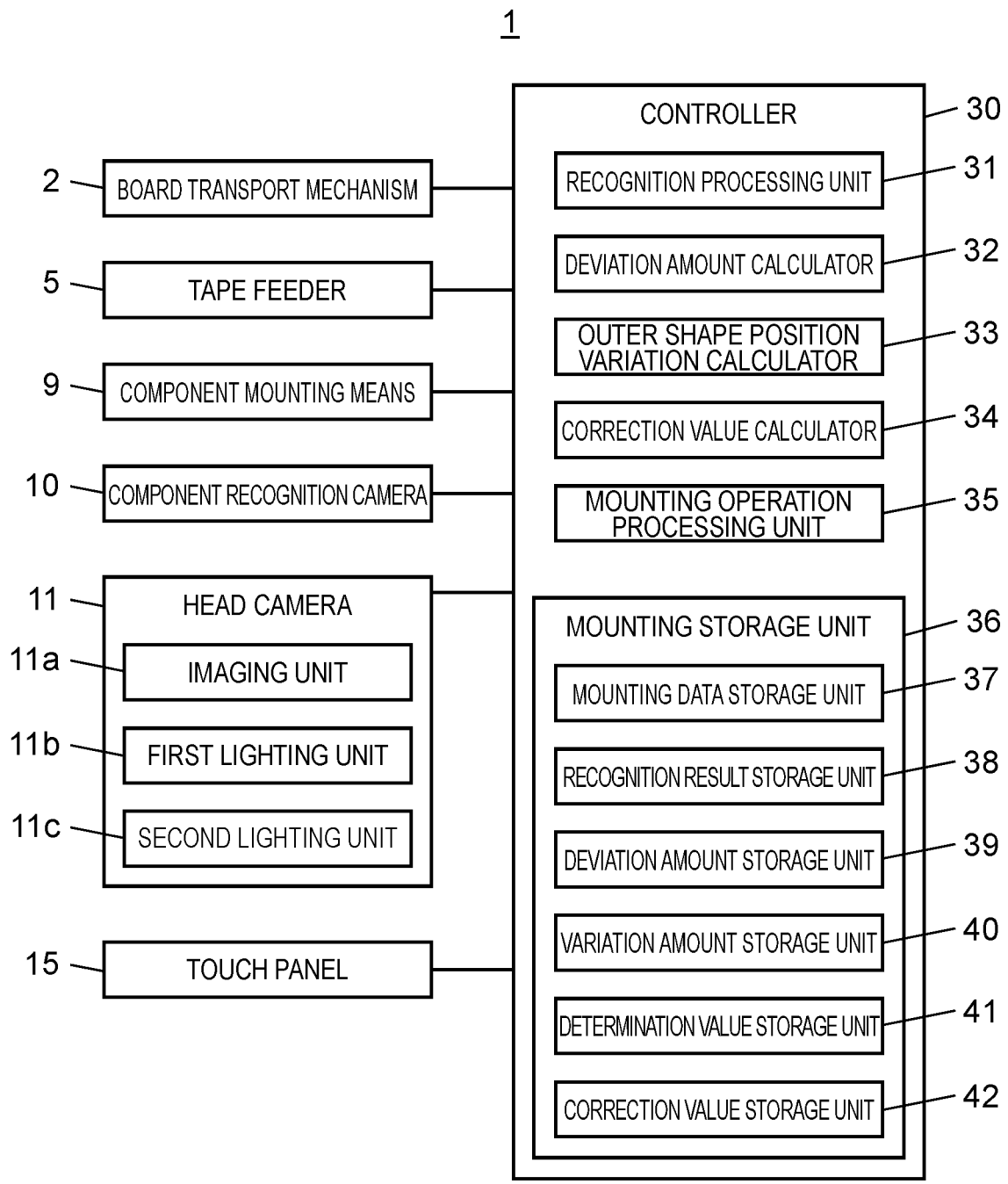
FIG. 8 is a block view showing a configuration of a control system of the component mounter according to the exemplary embodiment.

In FIG. 8, recognition processing unit 31 controls head camera 11 that has moved above component supply position 5a of tape feeder 5 to image component D stored in pocket 13b of component tape 13, and recognizes the captured image to acquire upper surface outer shape position Cd of component D and position Cs of the feature portion. Further, recognition processing unit 31 controls component recognition camera 10 to image lower surface Dd of component D held by suction nozzle 8b, and recognizes the captured image to acquire lower surface outer shape position Ce, which is the center position of component D. The acquired upper surface outer shape position Cd, feature portion position Cs, and lower surface outer shape position Ce of component D are stored in recognition result storage unit 38.

Figure 9A:
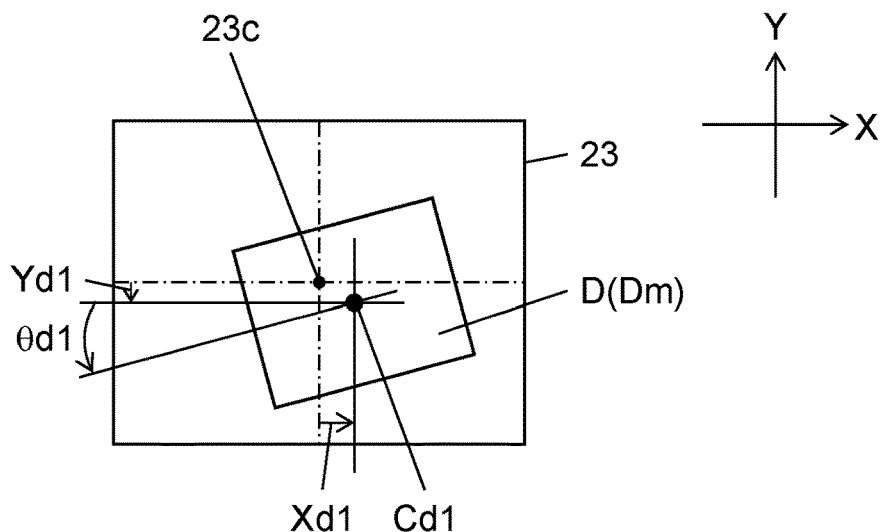
FIG. 9A is a view showing an example of imaging the component while being lit by the first light by the head camera provided in the component mounter according to the exemplary embodiment.

Here, with reference to FIG. 9, an example will be described in which recognition processing unit 31 controls head camera 11 that has moved above tape feeder 5, images component D at component supply position 5a, and recognizes the captured image to acquire upper surface outer shape position Cd of component D and position Cs of the feature portion. FIG. 9A is captured image 23 in which main body Dm of component D is imaged by imaging unit 11a in a state in which recognition processing unit 31 radiates component D under the first lighting condition lit by first lighting unit 11b. Recognition processing unit 31 recognizes captured image 23 to acquire upper surface outer shape position Cd1 (Xd1, Yd1, θd1) which is the position of the center of component D as seen from center 23c of captured image 23. In this way, the first outer shape position acquisition means (imaging unit 11a, first lighting unit 11b, recognition processing unit 31) acquire upper surface outer shape position Cd1 of component D.

Figure 9B:
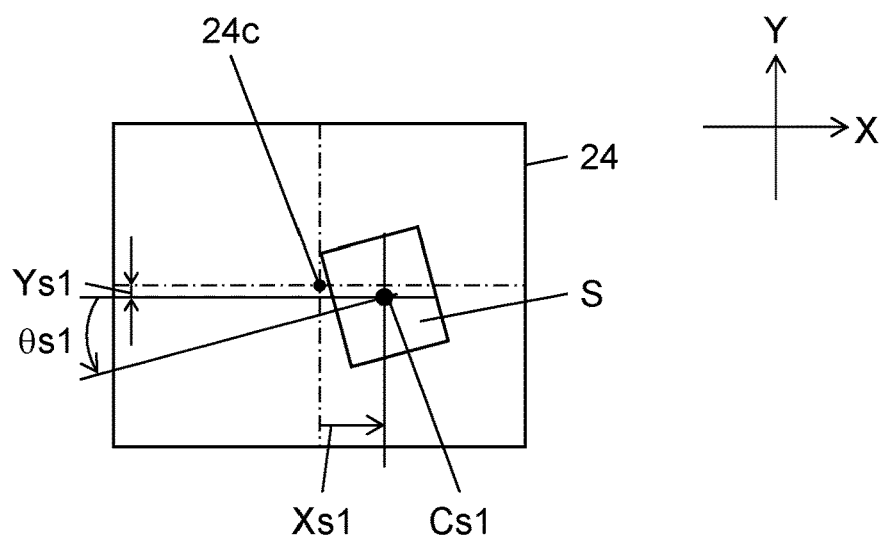
FIG. 9B is a view showing an example of imaging the component while being lit by the second light by the head camera provided in the component mounter according to the exemplary embodiment.

FIG. 9B is captured image 24 in which component D is imaged by imaging unit 11a in a state in which component D is radiated under the second lighting condition that recognition processing unit 31 lights by second lighting unit 11c. Recognition processing unit 31 recognizes captured image 24 to acquire position Cs1 (Xs1, Ys1, θs1) of the feature portion, which is the position of the center of light emitting portion S formed on component D as seen from center 24c of captured image 24. In this way, the feature portion position acquisition means (imaging unit 11a, second lighting unit 11c, and recognition processing unit 31) acquires position Cs1 of the feature portion.

Figure 9C:
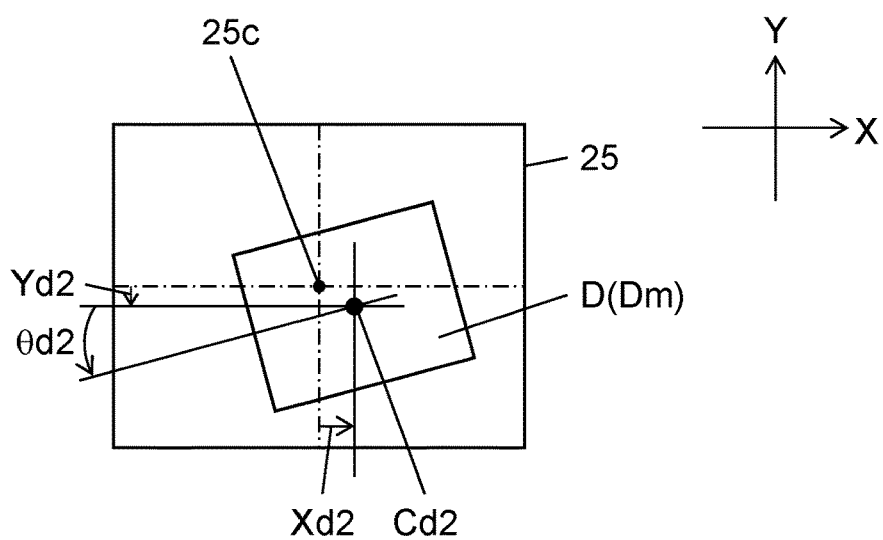
FIG. 9C is a view showing an example of re-imaging the component while being lit by the first light by the head camera provided in the component mounter of the exemplary embodiment.

FIG. 9C is captured image 25 in which main body Dm of component D is captured again by the first outer shape position acquisition means after position Cs1 of the feature portion is acquired, and upper surface outer shape position Cd2 (Xd2, Yd2, θd2) is acquired from captured image 25. The acquired upper surface outer shape positions Cd1 and Cd2 of component D and position Cs1 of the feature portion are stored in recognition result storage unit 38.

In FIG. 8, deviation amount calculator 32 calculates deviation amount ΔCs1 of light emitting portion S with respect to upper surface outer shape position Cd1 of component D from upper surface outer shape position Cd1 of component D stored in recognition result storage unit 38 and position Cs1 of the feature portion. Specifically, in FIG. 9, deviation amount calculator 32 calculates ΔXs1=Xs1−Xd1 as deviation amount ΔXs in the X direction, calculates ΔYs1=Ys1−Yd1 as deviation amount ΔYs in the Y direction, and calculates Δθs1=θs1−θd1 as deviation amount Δθs in the θ direction.

As described above, deviation amount calculator 32 calculates deviation amount ΔCs1 (Xs1−Xd1, Ys1−Yd1, θs1−θd1) of the feature portion (light emitting portion S) with respect to upper surface outer shape position Cd1 from upper surface outer shape position Cd1 (Xd1, Yd1, θd1) and position Cs1 (Xs1, Ys1, θs1) of the feature portion. The calculated deviation amount ΔCs1 is stored in deviation amount storage unit 39.

In FIG. 8, outer shape position variation calculator 33 calculates outer shape position variation amount ΔCd2 which is the difference in position between upper surface outer shape position Cd2 (first outer shape position) of component D acquired again by the first outer shape position acquisition means and previously acquired upper surface outer shape position Cd1 (first outer shape position) of component D from upper surface outer shape positions Cd1 and Cd2 of component D stored in recognition result storage unit 38. That is, after acquiring upper surface outer shape position Cd1 of component D and position Cs1 of the feature portion, the amount of variation in which imaging unit 11a and component D move relative to each other while acquiring upper surface outer shape position Cd2 of component D is calculated again. For example, if component D supplied by tape feeder 5 is imaged before component D stops at component supply position 5a or before the vibration of head camera 11 that has moved and stopped converges, outer shape position variation amount ΔCd2 becomes large.

Specifically, in FIG. 9, outer shape position variation calculator 33 calculates ΔXd2=Xd2−Xd1 as outer shape position variation amount ΔXd in the X direction, calculates ΔYd2=Yd2−Yd1 as outer shape position variation amount ΔYd in the Y direction, and calculates Δθd2=θd2−θd1 as outer shape position variation amount Δθd in the θ direction. The calculated outer shape position variation amount ΔCd2 (Xd2−Xd1, Yd2−Yd1, θd2−θd1) is stored in variation amount storage unit 40.

In FIG. 8, correction value calculator 34 calculates correction value ΔCf (ΔXf, ΔYf, Δθf) for mounting light emitting portion S (feature portion) of component D held by suction nozzle 8b (holding member) at light emitting portion mounting position Cg stored in mounting data storage unit 37. Specifically, correction value calculator 34 calculates correction value ΔCf (ΔXf, ΔYf, Δθf) based on ideal position Cs0 (Xs0, Ys0) of the feature portion stored in mounting data storage unit 37 and deviation amount ΔCs (Xs, ΔYs, Δθs) stored in deviation amount storage unit 39.

Figure 10:
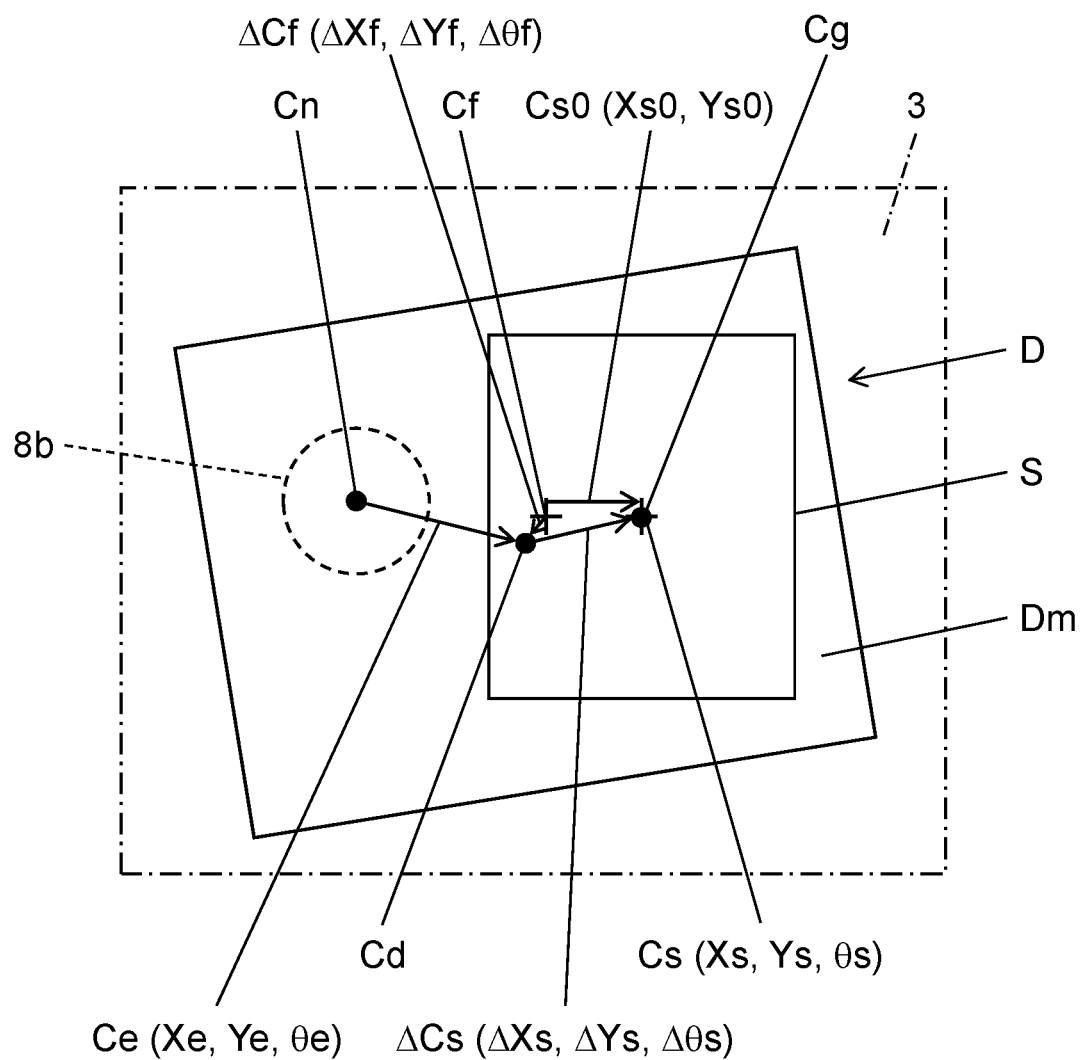
FIG. 10 is an explanatory view of a correction value of a mounting position by the component mounter according to the exemplary embodiment.

Here, with reference to FIG. 10, a calculation example of correction value ΔCf (ΔXf, ΔYf, Δθf) by correction value calculator 34 will be described. Component mounting position Cf and light emitting portion mounting position Cg are set on board 3 on which component D is mounted. The position of light emitting portion mounting position Cg as seen from component mounting position Cf is ideal position Cs0 (Xs0, Ys0) of the feature portion (light emitting portion S of component D). Further, position Cs (Xs, Ys, θs) of the feature portion of component D as seen from upper surface outer shape position Cd of component D is deviation amount ΔCs (ΔXs, ΔYs, Δθs) of the feature portion of component D.

Correction value calculator 34 calculates correction value ΔCf (ΔXf, ΔYf, Δθf) for correcting the deviation of light emitting portion S formed on component D from the ideal position. Specifically, ΔXf=ΔXs−Xs0 is calculated as correction value ΔXf in the X direction, ΔYf=ΔYs−Ys0 is calculated as correction value ΔYf in the Y direction, and Δθd=Δθs is calculated as correction value Δθf in the θ direction. The calculated correction value ΔCf (ΔXs−Xs0, ΔYs−Ys0, Δθs) is stored in correction value storage unit 42.

In FIG. 8, mounting operation processing unit 35 controls component mounting means 9 to hold component D supplied by tape feeder 5 (component supply means) by suction nozzle 8b (holding member), controls the mounting operation of mounting component D on board 3 positioned on board transport mechanism 2. That is, mounting operation processing unit 35 is a controller that controls the operation of component mounting means 9. Mounting operation processing unit 35 (controller) mounts component D on board 3 based on lower surface outer shape position Ce (Xe, Ye, θe) of component D held by suction nozzle 8b stored in recognition result storage unit 38 and correction value ΔCf (ΔXs−Xs0, ΔYs−Ys0, Δθs) of component D stored in correction value storage unit 42.

Here, an example of mounting component D by mounting operation processing unit 35 will be described with reference to FIG. 10. In FIG. 10, the position of the center of component D as seen from nozzle center Cn of suction nozzle 8b holding component D is lower surface outer shape position Ce (Xe, Ye, θe). Mounting operation processing unit 35 mounts component D held by suction nozzle 8b on board 3 from lower surface outer shape position Ce (Xe, Ye, θe) and correction value ΔCf (ΔXs−Xs0, ΔYs−Ys0, Δθs) of component D held by suction nozzle 8b.

Specifically, mounting operation processing unit 35 mounts component D on board 3 so that upper surface outer shape position Cd, which is the center of component D, is positioned at the position corrected by correction value ΔCf (ΔXs−Xs0, ΔYs−Ys0, Δθs) calculated from deviation amount ΔCs (ΔXs, ΔYs, Δθs) of the feature portion (light emitting portion S) of component D held by suction nozzle 8b, from component mounting position Cf set on board 3. As a result, the feature portion (light emitting portion S) of component D is mounted to be positioned at light emitting portion mounting position Cg set on board 3 in the correct posture (rotation angle θs in the horizontal plane).

As described above, mounting operation processing unit 35 (controller) causes component mounting means 9 to mount component D so that the feature portion (light emitting portion S) of component D is positioned on the target position (light emitting portion mounting position Cg) of board 3, based on the second outer shape position (lower surface outer shape position Ce (Xe, Ye, θe)) acquired by the second outer shape position acquisition means (component recognition camera 10 and recognition processing unit 31) and deviation amount ΔCs (ΔXs, ΔYs, Δθs). The mounting of component D by mounting operation processing unit 35 is not limited to the correction using the above correction value ΔCf (ΔXs−Xs0, ΔYs−Ys0, Δθs), and other parameters may be acquired and corrected.

Figure 11A:
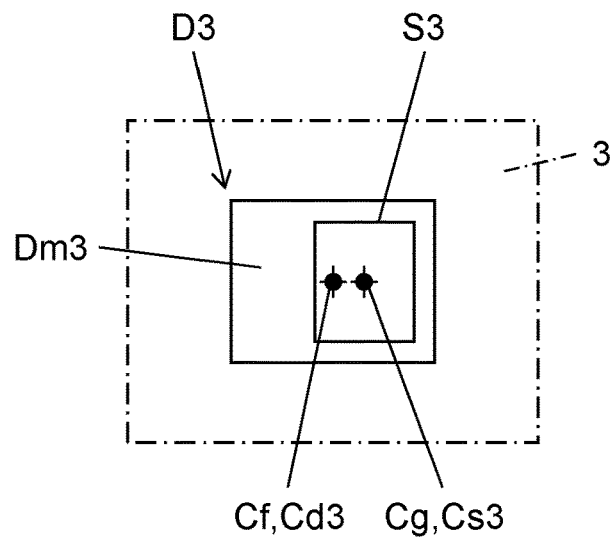
FIG. 11A is a view showing an example of a component mounted on the board by the component mounter according to the exemplary embodiment.

Here, with reference to FIGS. 11A to 11C, an example will be described in which the deviations of light emitting portions S3 to S5 formed on components D3 to D5 are corrected, and light emitting portions S3 to S5 of respective components D3 to D5 are mounted to be positioned at the target positions (light emitting portion mounting position Cg) of board 3. FIG. 11A is an example in which light emitting portion S3 of component D3 is formed at an ideal position in main body Dm3. In this case, by mounting component D3 so that upper surface outer shape position Cd3 is positioned at component mounting position Cf on board 3, position Cs3 of light emitting portion S3 of component D3 is positioned at light emitting portion mounting position Cg on board 3.

Figure 11B:
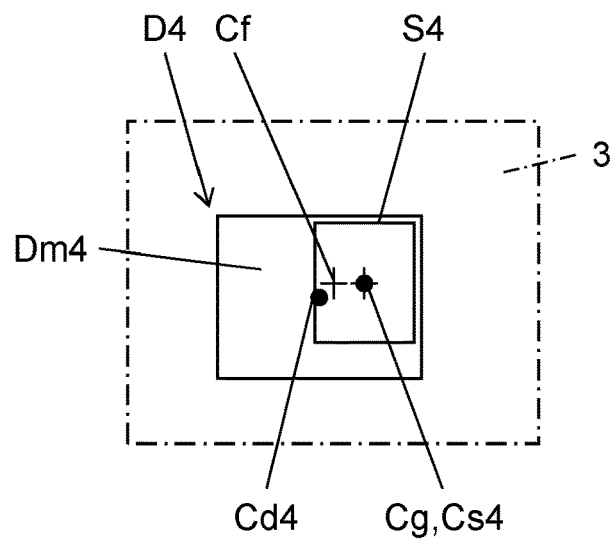
FIG. 11B is a view showing an example of a component mounted on the board by the component mounter according to the exemplary embodiment.

FIG. 11B is an example in which light emitting portion S4 of component D4 is formed to be deviated in parallel from the ideal position in main body Dm4. Mounting operation processing unit 35 mounts component D4 so that light emitting portion S4 of component D4 is positioned on the target position (light emitting portion mounting position Cg) on board 3 based on upper surface outer shape position Cd4 of component D4 acquired by the first outer shape position acquisition means (imaging unit 11a, first lighting unit 11b, and recognition processing unit 31) and deviation amount ΔCs4 calculated from position Cs4 of the feature portion acquired by the feature portion position acquisition means (imaging unit 11a, second lighting unit 11c, and recognition processing unit 31).

Figure 11C:
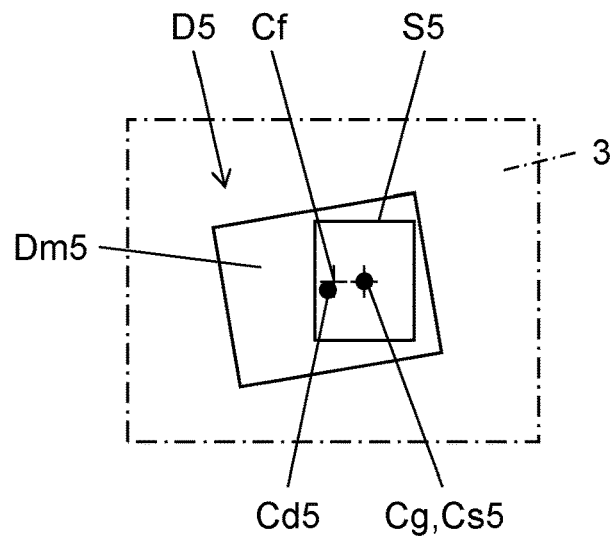
FIG. 11C is a view showing an example of a component mounted on the board by the component mounter according to the exemplary embodiment.

FIG. 11C is an example in which light emitting portion S5 of component D5 is formed by rotating with respect to main body Dm5. Mounting operation processing unit 35 mounts component D5 so that light emitting portion S5 of component D5 is positioned on the target position (light emitting portion mounting position Cg) on board 3 based on upper surface outer shape position Cd5 of component D5 acquired by the first outer shape position acquisition means (imaging unit 11a, first lighting unit 11b, recognition processing unit 31) and deviation amount ΔCs5 calculated from position Cs5 of the feature portion acquired by the feature portion position acquisition means (imaging unit 11a, second lighting unit 11c, recognition processing unit 31).

In FIG. 8, determination value storage unit 41 stores variation amount determination range Rd (for example, 10 μm or less). Variation amount determination range Rd is the determination range of outer shape position variation amount ΔCd for determining whether the vibration of head camera 11 (imaging unit 11a) that acquires upper surface outer shape position Cd of component D has converged, or the position of component D in tape feeder 5 has not changed, or stopped. When outer shape position variation amount ΔCd calculated by outer shape position variation calculator 33 is outside variation amount determination range Rd, that is, when head camera 11 or component D is still moving or the position of component D has changed, the feature portion position acquisition means acquires position Cs of the feature portion of component D again, and the first outer shape position acquisition means subsequently acquires upper surface outer shape position Cd of component D.

When outer shape position variation amount ΔCd stored in variation amount storage unit 40 is within variation amount determination range Rd, that is, if head camera 11 or component D stops or the variation is within an allowable range, mounting operation processing unit 35 holds component D by suction nozzle 8b to execute the mounting operation of mounting on board 3. As described above, when the difference in position (outer shape position variation amount ΔCd) calculated by outer shape position variation calculator 33 is outside a predetermined range (variation amount determination range Rd), the feature portion position acquisition means acquires position Cs of the feature portion (light emitting portion S) of component D again. Further, when the difference in position (outer shape position variation amount ΔCd) calculated by outer shape position variation calculator 33 is within the predetermined range (variation amount determination range Rd), the controller (mounting operation processing unit 35) causes the holding member (suction nozzle 8b) to hold component D.

In this way, mounting operation processing unit 35 determines whether or not the relative position of head camera 11 with respect to component D is stable based on outer shape position variation amount ΔCd, and repeats acquisition of position Cs of the feature portion and upper surface outer shape position Cd until the relative position becomes stable (outside variation amount determination range Rd). Then, when the relative position becomes stable (within variation amount determination range Rd), mounting operation processing unit 35 picks up component D from component supply position 5a by suction nozzle 8b. As a result, the measurement error of deviation amount ΔCs can be reduced, and the position of light emitting portion S of component D (light emitting component) can be accurately mounted on board 3.

In FIG. 8, determination value storage unit 41 stores deviation amount determination range Rs, which is an allowable range of deviation amount ΔCs, which is position Cs of the feature portion with respect to upper surface outer shape position Cd of component D. Component D whose deviation amount ΔCs is outside deviation amount determination range Rs is not mounted on board 3. That is, when deviation amount ΔCs is larger than a predetermined range (deviation amount determination range Rs), mounting operation processing unit 35 (controller) causes touch panel 15 to display a warning to that effect without causing suction nozzle 8b (holding member) to hold component D. Alternatively, when deviation amount ΔCs is larger than the predetermined range (deviation amount determination range Rs), mounting operation processing unit 35 picks up component D by suction nozzle 8b and causes component disposal unit 16 to dispose of component D.

Figure 12:
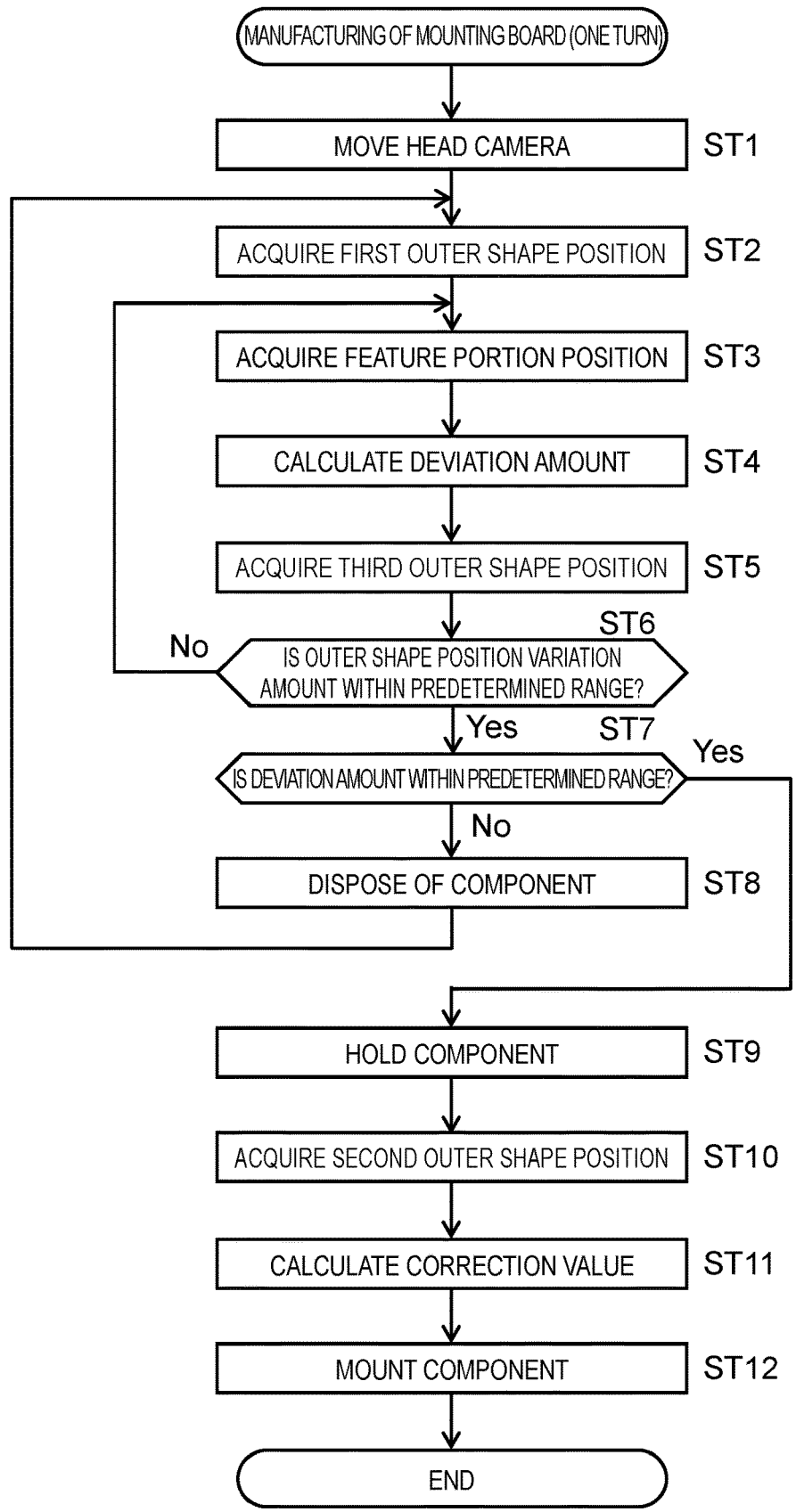
FIG. 12 is a flowchart of a method for manufacturing the mounting board according to the exemplary embodiment in one turn.

Next, along the flow of FIG. 12, among the methods for manufacturing the mounting board by the component mounter 1 with reference to FIGS. 7, 9 and 10, one turn of the step in which component mounting means 9 picks up component D from tape feeder 5 (component supply means) and mounts component D on board 3 will be described. In FIG. 12, first, mounting operation processing unit 35 controls component mounting means 9 to move head camera 11 above component D stored in pocket 13b of component tape 13 at component supply position 5a of tape feeder 5 (ST1: head camera movement step).

Next, with first lighting unit 11b lighting component D, imaging unit 11a images component D from above (first direction), and recognition processing unit 31 recognizes captured image 23 (FIG. 9A) to acquire upper surface outer shape position Cd1 (first outer shape position) of component D (ST2: first outer shape position acquisition step). Next, with second lighting unit 11c lighting component D, imaging unit 11a images component D from above (first direction), and recognition processing unit 31 recognizes captured image 24 (FIG. 9B) to acquire position Cs1 of the feature portion formed on component D (ST3: feature portion position acquisition step).

That is, in the first outer shape position acquisition step (ST2), component D is imaged in a state in which component D is lit under the first lighting condition. In the feature portion position acquisition step (ST3), component D is imaged in a state in which component D is lit under the second lighting condition, which is a different lighting condition from the first lighting condition. When the outer shape of component D and light emitting portion S can be imaged under the same lighting conditions, and upper surface outer shape position Cd1 and position Cs1 of the feature portion can be acquired from one piece of captured image, the first outer shape position acquisition step (ST2) and the feature portion position acquisition step (ST3) may be executed at the same time.

In FIG. 12, next, deviation amount calculator 32 calculates deviation amount ΔCs (FIG. 10) of the feature portion (light emitting portion S) with respect to upper surface outer shape position Cd1 from upper surface outer shape position Cd1 and position Cs1 of the feature portion (ST4: deviation amount calculation step). The calculated deviation amount ΔCs is stored in deviation amount storage unit 39. Next, with first lighting unit 11b lighting component D, imaging unit 11a further images component D from above, and recognition processing unit 31 recognizes captured image 25 (FIG. 9C) to acquire upper surface outer shape position Cd2 of component D (ST5: third outer shape position acquisition step). That is, after the feature portion position acquisition step (ST3), component D is further imaged to acquire upper surface outer shape position Cd2 (first outer shape position) of component D.

Next, outer shape position variation calculator 33 calculates the difference (outer shape position variation amount ΔCd) in position between upper surface outer shape position Cd1 (first outer shape position) acquired in the first outer shape position acquisition step (ST2) and upper surface outer shape position Cd2 (first outer shape position) acquired in the third outer shape position acquisition step (ST5) to determine whether or not outer shape position variation amount ΔCd is within the predetermined range (variation amount determination range Rd) (ST6: variation amount determination step). When outer shape position variation amount ΔCd is outside the predetermined range (variation amount determination range Rd) (No in ST6), the feature portion position acquisition step (ST3) is executed again for component D.

In FIG. 12, when outer shape position variation amount ΔCd is within the predetermined range (variation amount determination range Rd) (Yes in ST6), it is determined whether or not deviation amount ΔCs stored in deviation amount storage unit 39 is within the predetermined range (deviation amount determination range Rs) (ST7: deviation amount determination step). When deviation amount ΔCs is larger than the predetermined range (deviation amount determination range Rs) (No in ST7), mounting operation processing unit 35 (controller) causes component D to be disposed of by component disposal unit 16 (ST8: component disposal step). Thereafter, new component D is supplied to component supply position 5a of tape feeder 5, and the first outer shape position acquisition step (ST2) is executed for new component D.

When deviation amount ΔCs is larger than the predetermined range (deviation amount determination range Rs) (No in ST7), mounting operation processing unit 35 may display a warning to that effect on touch panel 15. That is, when deviation amount ΔCs is larger than the predetermined range (deviation amount determination range Rs), the holding member (suction nozzle 8b) does not hold component D. Thereafter, the operator determines whether to dispose of component D or mount component D on board 3 as it is, and gives an instruction to component mounter 1.

In FIG. 12, when deviation amount ΔCs is within the predetermined range (deviation amount determination range Rs) (Yes in ST7), mounting operation processing unit 35 (controller) causes suction nozzle 8b (holding member) to hold component D (ST9: component holding step). That is, when outer shape position variation amount ΔCd is within the predetermined range (variation amount determination range Rd) (Yes in ST6) and deviation amount ΔCs is within the predetermined range (deviation amount determination range Rs) (Yes in ST7), component D to be mounted on board 3 is held by suction nozzle 8b (ST9).

Next, component recognition camera 10 images component D held by the holding member (suction nozzle 8b) from the second direction (lower side) different from the first direction (upper side), and recognition processing unit 31 recognizes captured image 22 (FIG. 7B) to acquire lower surface outer shape position Ce (second outer shape position) of component D (ST10: second outer shape position acquisition step). The acquired lower surface outer shape position Ce is stored in recognition result storage unit 38. Next, correction value calculator 34 calculates correction value ΔCf (FIG. 10) based on ideal position Cs0 of the feature portion stored in mounting data storage unit 37 and deviation amount ΔCs stored in deviation amount storage unit 39 (ST11: correction value calculation step).

In FIG. 12, next, mounting operation processing unit 35 controls component mounting means 9 to mount the feature portion (light emitting portion S) of component D to be positioned on the target position (light emitting portion mounting position Cg) of board 3 based on lower surface outer shape position Ce (second outer shape position) of component D acquired by the second outer shape position acquisition step (ST10) and correction value ΔCf calculated from deviation amount ΔCc in the correction value calculation step (ST11) (ST12: mounting step).

In the above description, an example has been described in which component D supplied from tape feeder 5 is picked up by suction nozzle 8b and mounted so that light emitting portion S of component D is positioned at the target position of board 3. However, component D mounted on board 3 by using the method for manufacturing the mounting board of the present exemplary embodiment is not limited to component D supplied from tape feeder 5. For example, component D may be supplied by a component supply means such as a tray feeder or a bulk feeder. Further, component D may be component D transferred from the component supply means on a temporary stand provided in component mounter 1.

Further, in the feature portion position acquisition step (ST3), it is preferable to light with blue light in a wavelength region of about 400 nm to 500 nm as the second lighting condition. This is because the wavelength region described above is a wavelength region suitable for the phosphor contained in sealing resin Sr of light emitting portion S, and light emitting portion S can be recognized more clearly. The second lighting condition is not limited thereto, and an angle or a wavelength band may be appropriately selected depending on the type of component D and the type of the phosphor contained in light emitting portion S.

As described above, a method for manufacturing a mounting board of the present exemplary embodiment includes a first outer shape position acquisition step (ST2), a feature portion position acquisition step (ST3), a calculation step (ST4), and a holding step (ST9), a second outer shape position acquisition step (ST10), and a mounting step (ST12).

In the first outer shape position acquisition step (ST2), component D is imaged from the first direction (upper side) to acquire upper surface outer shape position Cd (first outer shape position) of component D.

In the feature portion position acquisition step (ST3), position Cs of the feature portion formed on component D is acquired.

In the calculation step (ST4), deviation amount ΔCs of the feature portion is calculated from upper surface outer shape position Cd and position Cs of the feature portion.

In the holding step (ST9), component D is held by the holding member (suction nozzle 8b).

In the second outer shape position acquisition step (ST10), component D held by the holding member is imaged from the second direction (lower side) to acquire lower surface outer shape position Ce (second outer shape position) of component D.

In the mounting step (ST12), the feature portion of component D is mounted to be positioned on the target position (light emitting portion mounting position Cg) of board 3 based on the acquired lower surface outer shape position Ce and deviation amount ΔCs.

As a result, the position of light emitting portion S of component D (light emitting component) can be accurately mounted on board 3.

According to the present disclosure, the position of the light emitting portion of the light emitting component can be accurately mounted on the board.

INDUSTRIAL APPLICABILITY

A method for manufacturing a mounting board and a component mounter of the present disclosure have an effect that the position of a light emitting portion of a light emitting component can be accurately mounted on a board, and are useful in the field of mounting a component on the board.

REFERENCE MARKS IN THE DRAWINGS

1 Component mounter
1a Base
2 Board transport mechanism
3 Board
4 Component supply unit
5 Tape feeder (component supply means)
5a Component supply position
6 Axis table
7 Beam
7a Plate
8 Mounting head
8a Suction unit
8b Suction nozzle (holding member)
9 Component mounting means
10 Component recognition camera (second outer shape position acquisition means)
11a Imaging unit (first outer shape position acquisition means, feature portion position acquisition means, camera)
11b First lighting unit (first outer shape position acquisition means)
11c Second lighting unit (feature portion position acquisition means)
11d Optical axis
12 Carriage
12a Feeder base
13 Component tape
13a Base tape
13b Pocket
13c Hole
13d Cover tape
14 Tape reel
15 Touch panel
16 Component disposal unit
17 Member
17a Opening portion
17b Edge portion
20 Captured image
20c Center
20x Center line
20y Center line
22 Captured image
21x Center line
21y Center line
22 Captured image
22c Center
22x Center line
22y Center line
23 Captured image
23c Center
24 Captured image
24c Center
25 Captured image
30 Controller
31 Recognition processing unit
32 Deviation amount calculator
33 Outer shape position variation calculator
34 Correction value calculator
35 Mounting operation processing unit
36 Mounting storage unit
37 Mounting data storage unit
38 Recognition result storage unit
39 Deviation amount storage unit
40 Variation amount storage unit
41 Determination value storage unit
42 Correction value storage unit
Cd, Cd1 to Cd5 Upper surface outer shape position (first outer shape position)
Ce Lower surface outer shape position (second outer shape position)
Cf Component mounting position
Cg Light emitting portion mounting position (target position)

Cn nozzle center
Cs, Cs1, Cs3 to Cs5 Position of feature portion
Cs0 Ideal position of feature portion
D, D3 to D5 Component
Dd Lower surface
Dm, Dm3 to Dm5 Main body
Du Upper surface
Rd Variation amount determination range
Rs Amount determination range
Sc Internal wiring
Sd Chip
Sr Sealing resin
S, S3 to S5 Light emitting portion (feature portion)
ΔCs Deviation amount

The invention claimed is:

1. A method for manufacturing a mounting board, the method comprising:
   a first outer shape position acquisition step of imaging a component from a first direction to acquire a first outer shape position of the component;
   a feature portion position acquisition step of imaging the component from the first direction to acquire a position of a feature portion formed on the component;
   a calculation step of calculating a deviation amount of the position of the feature portion with respect to the first outer shape position from the first outer shape position and the position of the feature portion;
   a holding step of holding the component with a holding member;
   a second outer shape position acquisition step of imaging, from a second direction, the component held by the holding member to acquire a second outer shape position of the component, the second direction being different from the first direction;
   a mounting step of mounting the component to a board so that the feature portion of the component is positioned on a target position of the board based on the second outer shape position and the deviation amount; and
   a third outer shape position acquisition step of imaging the component to acquire a first outer shape position of the component after the feature portion position acquisition step,
   wherein when a difference in positions of the first outer shape position acquired in the first outer shape position acquisition step and the first outer shape position acquired in the third outer shape position acquisition step is within a predetermined range, the component is held by the holding member.

2. The method for manufacturing a mounting board according to claim 1,
   wherein when the difference in the positions of the first outer shape position acquired in the first outer shape position acquisition step and the first outer shape position acquired in the third outer shape position acquisition step is out of the predetermined range, the feature portion position acquisition step is executed again.

3. The method for manufacturing a mounting board according to claim 1,
   wherein the first outer shape position acquisition step and the feature portion position acquisition step are executed for the component stored in a pocket of a component tape.

4. The method for manufacturing a mounting board according to claim 1,
   wherein when the deviation amount is larger than a predetermined range, the component is not held by the holding member.

5. The method for manufacturing a mounting board according to claim 1,
   wherein in the first outer shape position acquisition step, the component is imaged in a state in which the component is lit under a first lighting condition, and
   in the feature portion position acquisition step, the component is imaged in a state in which the component is lit under a second lighting condition different from the first lighting condition.

6. The method for manufacturing a mounting board according to claim 5,
   wherein the second lighting condition is to light the feature portion with light having a wavelength suitable for lighting the feature portion.

7. A component mounter comprising:
   a component supply mechanism that supplies a component;
   a first outer shape position acquisition unit that images the component supplied by the component supply mechanism from a first direction to acquire a first outer shape position of the component;
   a feature portion position acquisition unit that images the component supplied by the component supply mechanism from the first direction to acquire a position of a feature portion formed on the component;
   a deviation amount calculator that calculates a deviation amount of the position of the feature portion with respect to the first outer shape position from the first outer shape position and the position of the feature portion;
   a component mounting unit that holds the component with a holding member to mount the component on a board;
   a controller that controls an operation of the component mounting unit;
   a second outer shape position acquisition unit that images, from a second direction, the component held by the holding member to acquire a second outer shape position of the component, the second direction being different from the first direction; and
   an outer shape position variation calculator that calculates a difference in positions of a first outer shape position of the component acquired again by the first outer shape position acquisition unit and the previously acquired first outer shape position of the component,
   wherein the controller causes the component mounting unit to mount the component to a board so that the feature portion of the component is positioned on a target position of the board based on the second outer shape position and the deviation amount, and
   wherein when the difference in the positions calculated by the outer shape position variation calculator is within a predetermined range, the controller causes the holding member to hold the component.

8. The component mounter according to claim 7,
   wherein when the difference in the positions calculated by the outer shape position variation calculator is out of the predetermined range, the feature portion position acquisition unit acquires a position of the feature portion again.

9. The component mounter according to claim 7,
   wherein the component supplied by the component supply mechanism is stored in a pocket of a component tape, and
   the first outer shape position acquisition unit and the feature portion position acquisition unit image the component stored in the pocket.

10. The component mounter according to claim 7,
wherein when the deviation amount is larger than a predetermined range, the controller does not cause the holding member to hold the component.

11. The component mounter according to claim 7,
wherein the first outer shape position acquisition unit images the component in a state in which the component is lit under a first lighting condition, and
the feature portion position acquisition unit images the component in a state in which the component is lit under a second lighting condition that is a lighting condition different from the first lighting condition.

12. The component mounter according to claim 11,
wherein the second lighting condition is to light the feature portion with light having a wavelength suitable for lighting the feature portion.

13. The component mounter according to claim 7,
wherein the first outer shape position acquisition unit and the feature portion position acquisition unit share a camera that images the component.

14. A method for manufacturing a mounting board, the method comprising:
- a first outer shape position acquisition step of imaging a component from a first direction to acquire a first outer shape position of the component;
- a feature portion position acquisition step of imaging the component from the first direction to acquire a position of a feature portion formed on the component;
- a calculation step of calculating a deviation amount of the position of the feature portion with respect to the first outer shape position from the first outer shape position and the position of the feature portion;
- a holding step of holding the component with a holding member;
- a second outer shape position acquisition step of imaging, from a second direction, the component held by the holding member to acquire a second outer shape position of the component, the second direction being different from the first direction; and
- a mounting step of mounting the component to a board so that the feature portion of the component is positioned on a target position of the board based on the second outer shape position and the deviation amount, wherein when the deviation amount is larger than a predetermined range, the component is not held by the holding member.

* * * * *